United States Patent
Lewis, II et al.

(10) Patent No.: US 8,787,023 B2
(45) Date of Patent: Jul. 22, 2014

(54) RAIL MOUNTING CLAMP FOR ELECTRONIC EQUIPMENT ENCLOSURE

(75) Inventors: Richard Evans Lewis, II, Austin, TX (US); D. Brian Donowho, Austin, TX (US)

(73) Assignee: Chatsworth Products, Inc., Westlake Village, CA (US)

( * ) Notice: Subject to any disclaimer, the term of this patent is extended or adjusted under 35 U.S.C. 154(b) by 533 days.

(21) Appl. No.: 13/229,707

(22) Filed: Sep. 10, 2011

(65) Prior Publication Data

US 2012/0062083 A1 Mar. 15, 2012

Related U.S. Application Data

(60) Provisional application No. 61/381,912, filed on Sep. 10, 2010.

(51) Int. Cl.
*H05K 5/02* (2006.01)
*H05K 7/14* (2006.01)
*H05K 7/18* (2006.01)

(52) U.S. Cl.
CPC .............. *H05K 7/183* (2013.01); *H05K 5/0217* (2013.01); *H05K 7/14* (2013.01)
USPC .......................................... 361/724; 361/829

(58) Field of Classification Search
CPC .......... A47B 81/00; A47B 97/00; A47F 7/00; H05K 5/00; H05K 5/02; H05K 5/0217; H05K 5/04; H05K 7/00; H05K 7/14; H05K 7/1417; H05K 7/18; H05K 7/183; H05K 7/186

USPC ................... 211/26; 312/223.1, 223.2, 223.6; 174/535; 361/724, 725, 727, 829
See application file for complete search history.

(56) References Cited

U.S. PATENT DOCUMENTS

| | | | |
|---|---|---|---|
| 1,129,040 A | 2/1915 | McClure | |
| 1,919,166 A * | 7/1933 | Lavarack | ...................... 361/829 |
| 2,039,886 A | 5/1936 | Cohn | |
| 2,424,217 A | 7/1947 | Bales | |

(Continued)

FOREIGN PATENT DOCUMENTS

| | | |
|---|---|---|
| AU | 2008254682 | 11/2012 |
| CN | 102177633 A | 9/2011 |

(Continued)

OTHER PUBLICATIONS

Information Disclosure Statement (IDS) Letter Regarding Common Patent Application(s), dated Oct. 18, 2013.

(Continued)

*Primary Examiner* — Michael Safavi
(74) *Attorney, Agent, or Firm* — Tillman Wright, PLLC; James D. Wright; David R. Higgins

(57) ABSTRACT

An electronic equipment enclosure includes a frame structure having side cross members between front and rear frames, a vertical mounting rail and a clamping bracket attached to the vertical mounting rail. At least one of the side cross members defines an interior-facing channel that extends at least substantially along the length thereof. Upon insertion into the channel, the clamping bracket is rotatable within the channel to tighten, and thereby fasten, the vertical mounting rail to the frame structure.

19 Claims, 5 Drawing Sheets

(56) References Cited

U.S. PATENT DOCUMENTS

| | | |
|---|---|---|
| 2,459,953 A | 1/1949 | Mills |
| 2,616,142 A | 11/1952 | Tinnerman |
| 2,667,368 A | 1/1954 | Ferguson |
| 2,756,369 A * | 7/1956 | Gorrie ............ 361/826 |
| 2,880,379 A * | 3/1959 | Stoddart et al. ............ 361/727 |
| 2,999,190 A * | 9/1961 | Armandroff et al. ......... 361/622 |
| 3,034,844 A | 5/1962 | Anderson et al. |
| 3,143,195 A | 8/1964 | Schroeder |
| 3,192,306 A | 6/1965 | Skonnord |
| 3,265,419 A | 8/1966 | Durnbaugh et al. |
| 3,404,931 A | 10/1968 | Fall et al. |
| 3,563,627 A | 2/1971 | Whipps |
| 3,585,333 A | 6/1971 | Valle et al. |
| 3,655,254 A | 4/1972 | Mayer et al. |
| 3,675,955 A | 7/1972 | Hajduk |
| 4,040,694 A | 8/1977 | Lascarrou |
| 4,101,233 A | 7/1978 | McConnell |
| 4,148,453 A | 4/1979 | Brantly |
| 4,497,411 A | 2/1985 | DeBortoli |
| 4,551,577 A | 11/1985 | Byrne |
| 4,553,674 A | 11/1985 | Yoshikawa et al. |
| 4,592,602 A | 6/1986 | Kuster et al. |
| 4,643,319 A | 2/1987 | Debus et al. |
| 4,715,502 A | 12/1987 | Salmon |
| 4,814,942 A * | 3/1989 | Robirds et al. ............ 361/607 |
| 4,869,380 A * | 9/1989 | Metcalfe et al. ............ 211/189 |
| 4,941,717 A | 7/1990 | Beaulieu |
| 4,944,082 A | 7/1990 | Jones et al. |
| 4,962,443 A | 10/1990 | Cole |
| 4,964,020 A | 10/1990 | Savage et al. |
| 4,988,008 A | 1/1991 | Blum et al. |
| 5,004,107 A | 4/1991 | Sevier et al. |
| 5,009,383 A | 4/1991 | Chapman |
| 5,020,866 A | 6/1991 | McIlwraith |
| 5,052,565 A * | 10/1991 | Zachrei .......... 211/182 |
| 5,149,026 A | 9/1992 | Allen |
| 5,165,770 A | 11/1992 | Hahn |
| 5,250,752 A | 10/1993 | Cutright |
| 5,263,252 A | 11/1993 | Bruggink |
| 5,275,296 A | 1/1994 | Zachrai |
| 5,284,254 A | 2/1994 | Rinderer |
| 5,294,748 A | 3/1994 | Schwenk et al. |
| 5,310,255 A | 5/1994 | Ranallo |
| 5,323,916 A | 6/1994 | Salmon |
| 5,333,950 A | 8/1994 | Zachrai |
| 5,372,262 A | 12/1994 | Benson et al. |
| 5,380,083 A | 1/1995 | Jones et al. |
| 5,380,803 A | 1/1995 | Coutant et al. |
| 5,460,441 A | 10/1995 | Hastings et al. |
| 5,488,543 A | 1/1996 | Mazura et al. |
| 5,497,444 A | 3/1996 | Wheeler |
| 5,498,073 A | 3/1996 | Charbonneau et al. |
| 5,536,079 A | 7/1996 | Kostic |
| 5,540,339 A | 7/1996 | Lerman |
| 5,542,549 A * | 8/1996 | Siemon et al. ............ 211/26 |
| 5,566,836 A | 10/1996 | Lerman |
| 5,586,012 A | 12/1996 | Lerman |
| 5,595,494 A | 1/1997 | Wiebe |
| 5,639,150 A | 6/1997 | Anderson et al. |
| 5,640,482 A | 6/1997 | Barry et al. |
| 5,695,263 A | 12/1997 | Simon et al. |
| 5,713,651 A | 2/1998 | Essig et al. |
| 5,728,973 A | 3/1998 | Jorgensen |
| 5,758,002 A | 5/1998 | Walters |
| 5,791,498 A | 8/1998 | Mills |
| 5,798,485 A | 8/1998 | Rohde et al. |
| 5,806,945 A | 9/1998 | Anderson et al. |
| 5,806,946 A | 9/1998 | Benner et al. |
| 5,819,956 A | 10/1998 | Rinderer |
| 5,933,563 A | 8/1999 | Schaffer et al. |
| 5,938,302 A | 8/1999 | Anderson et al. |
| 5,954,525 A | 9/1999 | Siegal et al. |
| 5,961,081 A | 10/1999 | Rinderer |
| 5,975,315 A | 11/1999 | Jordan |
| 5,992,808 A * | 11/1999 | Morrow ............ 248/222.52 |
| 5,997,117 A | 12/1999 | Krietzman |
| 6,008,621 A | 12/1999 | Madison et al. |
| 6,011,221 A | 1/2000 | Lecinski et al. |
| 6,019,446 A | 2/2000 | Laboch et al. |
| 6,036,290 A | 3/2000 | Jancsek et al. |
| 6,039,420 A | 3/2000 | Besserer et al. |
| 6,044,193 A | 3/2000 | Szetesi et al. |
| 6,047,838 A | 4/2000 | Rindoks et al. |
| 6,065,612 A | 5/2000 | Rinderer |
| 6,067,233 A | 5/2000 | English et al. |
| 6,095,345 A | 8/2000 | Gibbons |
| 6,103,973 A | 8/2000 | Sharp |
| 6,118,073 A | 9/2000 | Lau et al. |
| 6,123,203 A | 9/2000 | Gibbons |
| 6,123,400 A | 9/2000 | Nicolai et al. |
| 6,135,583 A | 10/2000 | Simon et al. |
| 6,155,658 A | 12/2000 | Woodward et al. |
| 6,179,398 B1 | 1/2001 | Martin |
| 6,181,549 B1 * | 1/2001 | Mills et al. ............ 361/679.59 |
| 6,185,098 B1 | 2/2001 | Benavides |
| 6,201,919 B1 | 3/2001 | Puetz et al. |
| D440,210 S | 4/2001 | Larsen et al. |
| 6,223,908 B1 | 5/2001 | Kurtsman |
| 6,231,142 B1 | 5/2001 | Pochet |
| 6,238,029 B1 | 5/2001 | Marzec et al. |
| 6,245,998 B1 | 6/2001 | Curry et al. |
| 6,254,207 B1 | 7/2001 | Leneutre |
| 6,282,854 B1 | 9/2001 | Vos et al. |
| 6,293,637 B1 | 9/2001 | Anderson et al. |
| 6,299,268 B1 | 10/2001 | Carle et al. |
| 6,313,405 B1 | 11/2001 | Rinderer |
| 6,315,132 B1 | 11/2001 | Hartel et al. |
| 6,321,917 B1 | 11/2001 | Mendoza |
| 6,327,150 B1 | 12/2001 | Levy et al. |
| 6,340,141 B1 | 1/2002 | Rinderer |
| 6,347,714 B1 | 2/2002 | Fournier et al. |
| 6,349,837 B1 | 2/2002 | Serban |
| 6,401,940 B1 | 6/2002 | Hartel et al. |
| 6,410,844 B1 | 6/2002 | Bruner et al. |
| 6,422,399 B1 | 7/2002 | Castillo et al. |
| 6,425,488 B1 | 7/2002 | Notohardjono et al. |
| 6,425,648 B1 | 7/2002 | Notohardjono et al. |
| 6,481,582 B1 | 11/2002 | Rinderer |
| 6,481,678 B1 | 11/2002 | Chong |
| 6,489,565 B1 | 12/2002 | Krietzman et al. |
| 6,502,702 B1 | 1/2003 | Hsue et al. |
| 6,504,100 B2 | 1/2003 | Lawrence et al. |
| 6,510,589 B2 | 1/2003 | Schrage |
| 6,513,770 B1 | 2/2003 | Franz et al. |
| 6,517,174 B2 | 2/2003 | Sevier |
| 6,527,351 B1 | 3/2003 | Sevier et al. |
| 6,541,705 B1 | 4/2003 | McGrath |
| 6,554,697 B1 | 4/2003 | Koplin |
| 6,561,602 B1 | 5/2003 | Sevier et al. |
| 6,565,166 B1 | 5/2003 | Bulk et al. |
| 6,570,754 B2 | 5/2003 | Foley et al. |
| 6,601,932 B1 | 8/2003 | Helgenberg et al. |
| 6,605,777 B1 | 8/2003 | Anderson et al. |
| 6,605,782 B1 | 8/2003 | Krietzman et al. |
| 6,629,505 B1 | 10/2003 | Cronk et al. |
| 6,632,999 B2 | 10/2003 | Sempliner et al. |
| 6,655,534 B2 | 12/2003 | Williams et al. |
| 6,695,149 B1 | 2/2004 | Cote et al. |
| 6,760,531 B1 | 7/2004 | Solheid et al. |
| 6,769,551 B2 * | 8/2004 | Rafferty et al. ............ 211/26 |
| 6,785,459 B2 | 8/2004 | Schmidt et al. |
| 6,788,535 B2 | 9/2004 | Dodgen et al. |
| 6,791,841 B1 | 9/2004 | Tirrell et al. |
| 6,796,437 B2 | 9/2004 | Krampotich et al. |
| 6,796,438 B2 | 9/2004 | Mendoza |
| 6,796,623 B1 | 9/2004 | Fontana et al. |
| 6,808,240 B2 | 10/2004 | Altena |
| 6,814,417 B2 | 11/2004 | Hartel et al. |
| 6,866,154 B2 | 3/2005 | Hartman et al. |
| 6,884,942 B2 | 4/2005 | McGrath et al. |
| 6,902,069 B2 | 6/2005 | Hartman et al. |
| 6,920,038 B2 | 7/2005 | Gehlbach |
| 6,930,886 B2 * | 8/2005 | Velez et al. ............ 361/727 |
| 6,945,616 B2 | 9/2005 | Webster et al. |

(56) References Cited

U.S. PATENT DOCUMENTS

| | | | |
|---|---|---|---|
| 6,992,247 B2 | 1/2006 | Rasmussen et al. | |
| 7,000,784 B2 | 2/2006 | Canty et al. | |
| 7,086,707 B2 | 8/2006 | Wyatt et al. | |
| 7,093,725 B2 | 8/2006 | Hartman et al. | |
| 7,141,891 B2 | 11/2006 | McNally et al. | |
| 7,144,320 B2 | 12/2006 | Turek et al. | |
| 7,168,576 B2 | 1/2007 | Williams | |
| 7,178,679 B2 | 2/2007 | Canty et al. | |
| 7,188,735 B2 | 3/2007 | Nakagawa et al. | |
| 7,204,371 B2 | 4/2007 | Woolsey et al. | |
| 7,255,409 B2 * | 8/2007 | Hu et al. | 312/334.4 |
| 7,255,640 B2 | 8/2007 | Aldag et al. | |
| 7,285,027 B2 | 10/2007 | McGrath et al. | |
| 7,293,666 B2 | 11/2007 | Mattlin et al. | |
| 7,312,980 B2 * | 12/2007 | Ewing et al. | 361/622 |
| 7,316,461 B2 | 1/2008 | Wyatt et al. | |
| 7,355,115 B2 | 4/2008 | Liang | |
| 7,362,941 B2 | 4/2008 | Rinderer et al. | |
| 7,364,243 B2 | 4/2008 | Wyatt et al. | |
| 7,378,046 B2 | 5/2008 | Canty et al. | |
| 7,406,242 B1 | 7/2008 | Braga | |
| 7,425,678 B2 | 9/2008 | Adducci et al. | |
| 7,427,713 B2 * | 9/2008 | Adducci et al. | 174/50 |
| 7,438,638 B2 | 10/2008 | Lewis et al. | |
| 7,458,859 B2 | 12/2008 | McGrath et al. | |
| D584,251 S | 1/2009 | Lewis, II et al. | |
| D584,252 S | 1/2009 | Lewis, II et al. | |
| 7,472,970 B2 | 1/2009 | Bergesch et al. | |
| 7,476,804 B2 * | 1/2009 | Adducci et al. | 174/50 |
| 7,485,803 B2 * | 2/2009 | Adducci et al. | 174/50 |
| 7,495,169 B2 * | 2/2009 | Adducci et al. | 174/50 |
| D588,081 S | 3/2009 | Lewis, II et al. | |
| 7,498,512 B2 | 3/2009 | Adducci et al. | |
| 7,504,581 B2 | 3/2009 | Adducci et al. | |
| 7,507,912 B1 | 3/2009 | Sempliner et al. | |
| D592,618 S | 5/2009 | Lewis, II et al. | |
| 7,542,287 B2 | 6/2009 | Lewis, II et al. | |
| D596,928 S | 7/2009 | Lawrence et al. | |
| 7,592,541 B2 * | 9/2009 | Adducci et al. | 174/50 |
| 7,637,771 B2 | 12/2009 | Laursen | |
| 7,643,291 B2 | 1/2010 | Mallia et al. | |
| 7,667,135 B2 * | 2/2010 | Adducci et al. | 174/50 |
| D611,326 S | 3/2010 | Alaniz et al. | |
| 7,697,285 B2 | 4/2010 | Donowho et al. | |
| 7,718,889 B2 * | 5/2010 | Rasmussen et al. | 174/50 |
| 7,718,891 B2 * | 5/2010 | Adducci et al. | 174/50 |
| 7,719,835 B1 | 5/2010 | Schluter | |
| 7,746,637 B2 | 6/2010 | Donowho et al. | |
| 7,772,489 B2 | 8/2010 | Adducci et al. | |
| 7,778,513 B2 | 8/2010 | Rinderer et al. | |
| 7,795,532 B2 * | 9/2010 | Walker | 174/50 |
| 7,804,685 B2 | 9/2010 | Krietzman | |
| 7,839,635 B2 | 11/2010 | Donowho et al. | |
| 7,874,433 B2 | 1/2011 | Levesque et al. | |
| 7,878,888 B2 | 2/2011 | Rasmussen et al. | |
| 7,880,084 B2 | 2/2011 | Adducci et al. | |
| 7,893,356 B2 | 2/2011 | Garza et al. | |
| 7,894,190 B2 | 2/2011 | Davis et al. | |
| 7,939,763 B2 | 5/2011 | Jones et al. | |
| 7,952,869 B2 | 5/2011 | Lewis, II et al. | |
| 7,957,139 B2 | 6/2011 | Davis et al. | |
| 7,973,242 B2 | 7/2011 | Jones et al. | |
| 7,974,105 B2 | 7/2011 | Dean et al. | |
| 7,999,183 B2 | 8/2011 | Garza et al. | |
| 8,003,890 B2 | 8/2011 | Donowho et al. | |
| 8,035,965 B2 | 10/2011 | Adducci et al. | |
| 8,040,673 B2 | 10/2011 | Krietzman | |
| 8,049,109 B2 | 11/2011 | Sempliner et al. | |
| 8,087,979 B2 | 1/2012 | Rasmussen | |
| 8,107,238 B2 | 1/2012 | Krietzman et al. | |
| 8,138,419 B2 | 3/2012 | Garza, Jr. et al. | |
| 8,281,940 B2 * | 10/2012 | Fan | 211/26 |
| 8,330,043 B2 | 12/2012 | Alaniz et al. | |
| 8,395,046 B2 | 3/2013 | Nicewicz et al. | |
| 8,403,736 B2 | 3/2013 | Rasmussen et al. | |
| 8,405,984 B2 | 3/2013 | Donowho et al. | |
| 8,411,465 B2 | 4/2013 | Dean, Jr. et al. | |
| 8,437,147 B2 | 5/2013 | Dean, Jr. et al. | |
| 8,443,987 B2 * | 5/2013 | Peng et al. | 211/26 |
| 8,459,756 B2 * | 6/2013 | Linhares et al. | 312/265.3 |
| 8,653,363 B2 | 2/2014 | Behrens et al. | |
| 2001/0015598 A1 | 8/2001 | Sevier | |
| 2002/0046979 A1 | 4/2002 | Larsen et al. | |
| 2002/0074149 A1 | 6/2002 | Lawrence et al. | |
| 2002/0197045 A1 | 12/2002 | Schmidt et al. | |
| 2003/0037953 A1 | 2/2003 | Sarkinen et al. | |
| 2003/0118311 A1 | 6/2003 | Thibault et al. | |
| 2004/0007372 A1 | 1/2004 | Krietzman et al. | |
| 2004/0016708 A1 | 1/2004 | Rafferty et al. | |
| 2004/0016713 A1 | 1/2004 | Wyatt et al. | |
| 2004/0020873 A1 | 2/2004 | Henderson | |
| 2004/0050808 A1 | 3/2004 | Krampotich et al. | |
| 2004/0069725 A1 | 4/2004 | Adducci et al. | |
| 2004/0146266 A1 | 7/2004 | Solheid et al. | |
| 2004/0173545 A1 | 9/2004 | Canty et al. | |
| 2004/0183409 A1 | 9/2004 | Rinderer | |
| 2004/0190270 A1 | 9/2004 | Aldag et al. | |
| 2004/0201335 A1 | 10/2004 | Davis | |
| 2004/0226900 A1 | 11/2004 | Canty et al. | |
| 2004/0231875 A1 | 11/2004 | Rasmussen et al. | |
| 2005/0221683 A1 | 10/2005 | McGrath et al. | |
| 2005/0247650 A1 | 11/2005 | Vogel et al. | |
| 2006/0043031 A1 | 3/2006 | Rinderer | |
| 2006/0087792 A1 | 4/2006 | Ng et al. | |
| 2006/0103270 A1 | 5/2006 | Bergesch et al. | |
| 2006/0118321 A1 | 6/2006 | Herring et al. | |
| 2006/0141921 A1 | 6/2006 | Turek et al. | |
| 2006/0162948 A1 | 7/2006 | Rinderer et al. | |
| 2006/0213853 A1 | 9/2006 | Schluter et al. | |
| 2007/0064389 A1 | 3/2007 | Lewis, II et al. | |
| 2007/0064391 A1 | 3/2007 | Lewis, II et al. | |
| 2007/0081874 A1 | 4/2007 | Kamino et al. | |
| 2007/0183129 A1 | 8/2007 | Lewis, II et al. | |
| 2007/0210679 A1 | 9/2007 | Adducci et al. | |
| 2007/0210680 A1 | 9/2007 | Appino et al. | |
| 2007/0210681 A1 | 9/2007 | Adducci et al. | |
| 2007/0210683 A1 | 9/2007 | Adducci et al. | |
| 2007/0210686 A1 | 9/2007 | Adducci et al. | |
| 2007/0221393 A1 | 9/2007 | Adducci et al. | |
| 2007/0293138 A1 | 12/2007 | Adducci et al. | |
| 2008/0035810 A1 | 2/2008 | Lewis, II | |
| 2008/0037228 A1 | 2/2008 | Lewis, II | |
| 2008/0062654 A1 | 3/2008 | Mattlin et al. | |
| 2008/0074849 A1 | 3/2008 | Adducci et al. | |
| 2008/0130262 A1 | 6/2008 | Rinderer et al. | |
| 2008/0174217 A1 | 7/2008 | Walker | |
| 2008/0180004 A1 | 7/2008 | Martich et al. | |
| 2008/0266789 A1 | 10/2008 | Hruby et al. | |
| 2008/0289873 A1 | 11/2008 | Herring et al. | |
| 2008/0316702 A1 | 12/2008 | Donowho et al. | |
| 2008/0316703 A1 | 12/2008 | Donowho et al. | |
| 2009/0014614 A1 | 1/2009 | Warmoth et al. | |
| 2009/0059523 A1 | 3/2009 | Mallia et al. | |
| 2009/0061755 A1 | 3/2009 | Calder et al. | |
| 2009/0093169 A1 | 4/2009 | McGrath et al. | |
| 2009/0129013 A1 | 5/2009 | Donowho et al. | |
| 2009/0151983 A1 | 6/2009 | Sempliner et al. | |
| 2009/0168306 A1 | 7/2009 | Sharp et al. | |
| 2009/0190307 A1 | 7/2009 | Krietzman | |
| 2009/0224110 A1 | 9/2009 | Donowho et al. | |
| 2009/0227197 A1 | 9/2009 | Lewis, II et al. | |
| 2009/0236117 A1 | 9/2009 | Garza et al. | |
| 2009/0239460 A1 | 9/2009 | Lucia et al. | |
| 2009/0239461 A1 | 9/2009 | Lewis, II et al. | |
| 2009/0273915 A1 | 11/2009 | Dean, Jr. et al. | |
| 2009/0283488 A1 | 11/2009 | McMillan, III et al. | |
| 2010/0051308 A1 | 3/2010 | Hansen et al. | |
| 2010/0061059 A1 | 3/2010 | Krietzman et al. | |
| 2010/0084188 A1 | 4/2010 | Rajvanshi et al. | |
| 2010/0096962 A1 | 4/2010 | Rajvanshi et al. | |
| 2010/0101820 A1 | 4/2010 | Alaniz et al. | |
| 2010/0122830 A1 | 5/2010 | Garza et al. | |
| 2010/0126750 A1 | 5/2010 | Garza et al. | |
| 2010/0126751 A1 | 5/2010 | Garza et al. | |

(56) References Cited

U.S. PATENT DOCUMENTS

| | | |
|---|---|---|
| 2010/0172092 A1 | 7/2010 | Davis et al. |
| 2010/0172093 A1 | 7/2010 | Davis et al. |
| 2010/0193241 A1 | 8/2010 | Bennett et al. |
| 2010/0193754 A1 | 8/2010 | Garza et al. |
| 2010/0200707 A1 | 8/2010 | Garza et al. |
| 2010/0243315 A1 | 9/2010 | Shumate et al. |
| 2011/0001408 A1 | 1/2011 | Caveney et al. |
| 2011/0019362 A1 | 1/2011 | Krietzman |
| 2011/0056895 A1 | 3/2011 | Tichy |
| 2011/0083873 A1 | 4/2011 | Hartman et al. |
| 2011/0148261 A1 | 6/2011 | Donowho et al. |
| 2011/0211328 A1 | 9/2011 | Dean, Jr. et al. |
| 2011/0211329 A1 | 9/2011 | Dean, Jr. et al. |
| 2011/0278060 A1 | 11/2011 | Rajvanshi et al. |
| 2011/0287704 A1 | 11/2011 | Lewis, II et al. |
| 2011/0290553 A1 | 12/2011 | Behrens et al. |
| 2012/0013229 A1 | 1/2012 | Krietzman |
| 2012/0062084 A1 | 3/2012 | Lewis, II et al. |
| 2012/0062086 A1 | 3/2012 | Garza, Jr. et al. |
| 2012/0062091 A1 | 3/2012 | Donowho et al. |
| 2012/0063099 A1 | 3/2012 | Alaniz et al. |
| 2012/0112612 A1 | 5/2012 | Krietzman |
| 2012/0305307 A1 | 12/2012 | Korcz et al. |
| 2013/0160271 A1 | 6/2013 | Krietzman et al. |
| 2013/0165035 A1 | 6/2013 | Krietzman et al. |

FOREIGN PATENT DOCUMENTS

| | | |
|---|---|---|
| DE | 19615759 A1 | 10/1997 |
| DE | 20207426 U1 | 9/2002 |
| EP | 0577433 | 1/1994 |
| EP | 2205054 A1 | 7/2010 |
| EP | 2429271 | 3/2012 |
| EP | 2429272 | 3/2012 |
| GB | 2366084 B | 9/2002 |
| GB | 2468823 B | 10/2012 |
| SE | 535066 C2 | 4/2012 |
| WO | 0101533 A1 | 1/2001 |
| WO | 2006055506 A2 | 5/2006 |
| WO | 2008022058 A2 | 2/2008 |
| WO | 2008022058 A3 | 11/2008 |
| WO | 2008144678 A1 | 11/2008 |
| WO | 2009089008 A2 | 7/2009 |
| WO | 2009089307 A2 | 7/2009 |
| WO | 2009103090 A2 | 8/2009 |
| WO | 2009103090 A3 | 10/2009 |
| WO | 2009143193 A2 | 11/2009 |
| WO | 2009089307 A3 | 12/2009 |
| WO | 2009143193 A3 | 3/2010 |
| WO | 2010028384 A2 | 3/2010 |
| WO | 2010028384 A3 | 5/2010 |
| WO | 2010117699 A1 | 10/2010 |
| WO | 2011088430 A2 | 7/2011 |
| WO | 2011088438 A2 | 7/2011 |

OTHER PUBLICATIONS

Information Disclosure Statement (IDS) Letter Regarding Common Patent Application(s), dated Apr. 29, 2013.
Information Disclosure Statement (IDS) Letter Regarding Common Patent Application(s), dated Jul. 10, 2013.
Information Disclosure Statement (IDS) Letter Regarding Common Patent Application(s), dated Jan. 27, 2014.
Chatsworth Products, Inc., "Thermal Management Solutions", Signature Solutions Brochure, Revision dated Mar. 2008, 6 pages, www.chatsworth.com/passivecooling.
Panduit Net-Access Vertical Exhaust System (VES) Specification Sheet, Panduit Corporation, dated Feb. 2011, 4 pages.
HP 10000 G2 42U Rack Air Duct Installation Guide, Hewlett-Packard Development Company, LP, dated Aug. 2008, 23 pages.
Chatsworth Products, Inc. "Cabinet Airflow Baffles—Air Dam Kit for CPI Cabinet Systems", Product Data Sheet, Jun. 2004, techsupport@chatsworth.com, 2 pages.
Information Disclosure Statement (IDS) Letter Regarding Common Patent Appliction(s), dated Apr. 22, 2014.

* cited by examiner

US 8,787,023 B2

RAIL MOUNTING CLAMP FOR ELECTRONIC EQUIPMENT ENCLOSURE

CROSS-REFERENCE TO RELATED APPLICATION

The present application is a U.S. non-provisional patent application of, and claims priority under 35 U.S.C. §119(e) to, U.S. provisional patent application Ser. No. 61/381,912, filed Sep. 10, 2010, which '912 application is incorporated by reference herein in its entirety. Additionally, each of the following U.S. patent applications, and any application publication thereof, is expressly incorporated by reference herein in its entirety:

(a) U.S. provisional patent application Ser. No. 61/381,904, filed Sep. 10, 2010, and entitled, "ELECTRONIC EQUIPMENT CABINET STRUCTURE;"
(b) U.S. provisional patent application Ser. No. 61/381,905, filed Sep. 10, 2010, and entitled, "CABLE PASS-THROUGH PANEL FOR ELECTRONIC EQUIPMENT ENCLOSURE;"
(c) U.S. provisional patent application Ser. No. 61/381,909, filed Sep. 10, 2010, and entitled, "RAIL SEAL FOR ELECTRONIC EQUIPMENT ENCLOSURE;"
(d) U.S. provisional patent application Ser. No. 61/381,918, filed Sep. 10, 2010, and entitled, "VERTICAL MOUNTING RAIL WITH CABLE MANAGEMENT FEATURES;"
(e) U.S. non-provisional patent application Ser. No. 13/229,704, filed Sep. 10, 2011, and entitled, "ELECTRONIC EQUIPMENT CABINET STRUCTURE;"
(f) U.S. non-provisional patent application Ser. No. 13/229,705, filed Sep. 10, 2011, and entitled, "CABLE PASS-THROUGH PANEL FOR ELECTRONIC EQUIPMENT ENCLOSURE;"
(g) U.S. non-provisional patent application Ser. No. 13/229,706, filed Sep. 10, 2011, and entitled, "RAIL SEAL FOR ELECTRONIC EQUIPMENT ENCLOSURE;" and
(h) U.S. non-provisional patent application Ser. No. 13/229,708, filed Sep. 10, 2011, and entitled, "VERTICAL MOUNTING RAIL WITH CABLE MANAGEMENT FEATURES."

COPYRIGHT STATEMENT

All of the material in this patent document is subject to copyright protection under the copyright laws of the United States and other countries. The copyright owner has no objection to the facsimile reproduction by anyone of the patent document or the patent disclosure, as it appears in official governmental records but, otherwise, all other copyright rights whatsoever are reserved.

BACKGROUND OF THE PRESENT INVENTION

1. Field of the Present Invention

The present invention relates generally to electronic equipment cabinet structures and enclosures, and, in particular, to rail mounting clamp brackets for installing vertical mounting rails in electronic equipment cabinet structures and enclosures.

2. Background

Racks, frames and cabinets for mounting and storing electronic components have been well known for many years. Frames and racks are typically simple rectangular frameworks on which electronic components may be mounted, or on which other mounting members, such as shelves or brackets, may be mounted which in turn may support the electronic components. Cabinets are typically frames on which panels or doors, or both, are hung to provide aesthetic improvement, to protect the components from external influences, to provide security for the components stored inside, or for other reasons. Racks, frames and cabinets (sometimes collectively referred to hereinafter as "enclosures") are often customized in order to best accommodate the components which they are designed to store.

In many such enclosures, equipment mounting rails are useful for mounting any of a variety of different equipment or accessories within the enclosure. Such equipment mounting rails are often mounted in a way so as to permit adjustment of the rail location within the enclosure. In particular, the frame members of some known enclosures utilize a clamping plate to clamp the equipment mounting rail to a structural member of the frame. However, during the process of fastening the equipment mounting rail, the clamping plate is permitted to rotate freely as it is tightened, which can inhibit the effective clamping force. In other known enclosures, a slot or channel in a structural member of the frame is utilized to prevent rotation of the fastener during installation of the equipment mounting rail. A square-headed stud is aligned within the slot or channel in order to maintain the fastener in a stationary position. However, such a design does not necessarily provide maximum clamping efficiency.

Accordingly, a need exists for a rail mounting clamp that improves upon the clamping force and efficiency of known rail mounting mechanisms. Furthermore, a need exists for a rail mounting clamp that substantially avoids free rotation during the process of fastening the equipment mounting rail to the enclosure frame.

SUMMARY OF THE PRESENT INVENTION

The present invention includes many aspects and features. Moreover, while many aspects and features relate to, and are described in, the context of enclosures for electronic equipment, the present invention is not limited to use only in enclosures for electronic equipment, as will become apparent from the following summaries and detailed descriptions of aspects, features, and one or more embodiments of the present invention.

Broadly defined, the present invention according to a first aspect includes an electronic equipment enclosure. The electronic equipment structure includes a frame structure that includes side cross members between front and rear frames, a vertical mounting rail, and a clamping bracket attached to the vertical mounting rail. At least one of the side cross members defines an interior-facing channel that extends at least substantially along the length thereof. Upon insertion into the channel, the clamping bracket is rotatable within the channel to tighten, and thereby fasten, the vertical mounting rail to the frame structure.

In features of this aspect, the vertical mounting rail may include an embossed portion at a location where the clamping bracket is attached thereto; the clamping bracket may be attached to the vertical mounting rail via a threaded rod and a separate clamp nut; the threaded rod may extend from a raised central portion of the clamping bracket and may be rigidly attached thereto; and, when the clamping bracket is attached to the vertical mounting rail, the raised central portion of the clamping bracket may be aligned with an embossed portion of the vertical mounting rail.

In further features of this aspect, the clamping bracket may include a flange at each side thereof and extending away from the central portion, each in the same direction; and the flanges may be spaced apart from one another so as to fittingly interface with and straddle a C-shaped portion of the vertical mounting rail.

In still further features of this aspect, the clamping bracket may include cut edges at opposite ends thereof to facilitate rotation of the clamping bracket within the channel; and the vertical mounting rail may be fastenable to the frame structure with a quarter turn of the clamping bracket such that the ends of the clamping bracket enter into upper and lower portions of the channel; the vertical mounting rail may be fastenable to the frame structure with a quarter turn of the clamping bracket such that the ends of the clamping bracket enter into upper and lower portions of the channel; and the clamping bracket may be made from a metal-based material.

Broadly defined, the present invention according to a second aspect includes an electronic equipment enclosure substantially as shown and described.

Broadly defined, the present invention according to a third aspect includes a mounting clamp for use in fastening a vertical mounting rail in an electronic equipment enclosure. The mounting clamp includes a clamping bracket that has a central portion having a pair of ends and a pair of flanges. Each flange extends from the central portion at opposite sides thereof, the flanges being spaced apart from one another to straddle a C-shaped portion of a vertical mounting rail. The mounting clamp further includes a threaded rod rigidly attached to the clamping bracket and extending from the central portion and a nut for engagement with the threaded rod to permit fastening of the clamping bracket to the vertical mounting rail.

In features of this aspect, the central portion of the clamping bracket may include a cut edge at each end thereof to facilitate rotation of the clamping bracket within a channel of the vertical mounting rail; and the cut edges may be located at corners of the central portion that are diagonally opposite one another.

Broadly defined, the present invention according to a fourth aspect includes a mounting clamp, for fastening a vertical mounting rail in an electronic equipment enclosure, as substantially shown and described.

Broadly defined, the present invention according to a fifth aspect includes a method of fastening a vertical mounting rail to an electronic equipment enclosure. The method includes the steps of providing a frame structure that includes side cross members between front and rear frames, wherein at least one of the side cross members defines an interior-facing channel that extends at least substantially along the length thereof; loosely attaching a clamping bracket having a pair of spaced-apart flanges at sides thereof to a vertical mounting rail having a C-shaped portion; configuring the clamping bracket such that the pair of spaced-apart flanges are oriented crosswise relative to the vertical mounting rail; inserting the clamping bracket into the channel of a selected side cross member; and rotating the clamping bracket within the channel to position ends of the clamping bracket within the channel and align the spaced-apart flanges to straddle the C-shaped portion.

In features of this aspect, cut edges may be arranged at diagonally opposite corners of a central portion of the clamping bracket, and the rotating step may include rotating the clamping bracket such that the cut edges are the leading edges as the rotation is carried out; the rotating step may include one quarter turn of rotation; the attaching step may include attaching the clamping bracket to the vertical mounting rail with a threaded rod and a clamp nut; and the method may further include, after the rotating step, the step of tightening the clamp nut.

Broadly defined, the present invention according to a sixth aspect includes a method of fastening a vertical mounting rail in an electronic equipment enclosure as substantially shown and described.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

Further features, embodiments, and advantages of the present invention will become apparent from the following detailed description with reference to the drawings, wherein.

DETAILED DESCRIPTION

Figure 1:
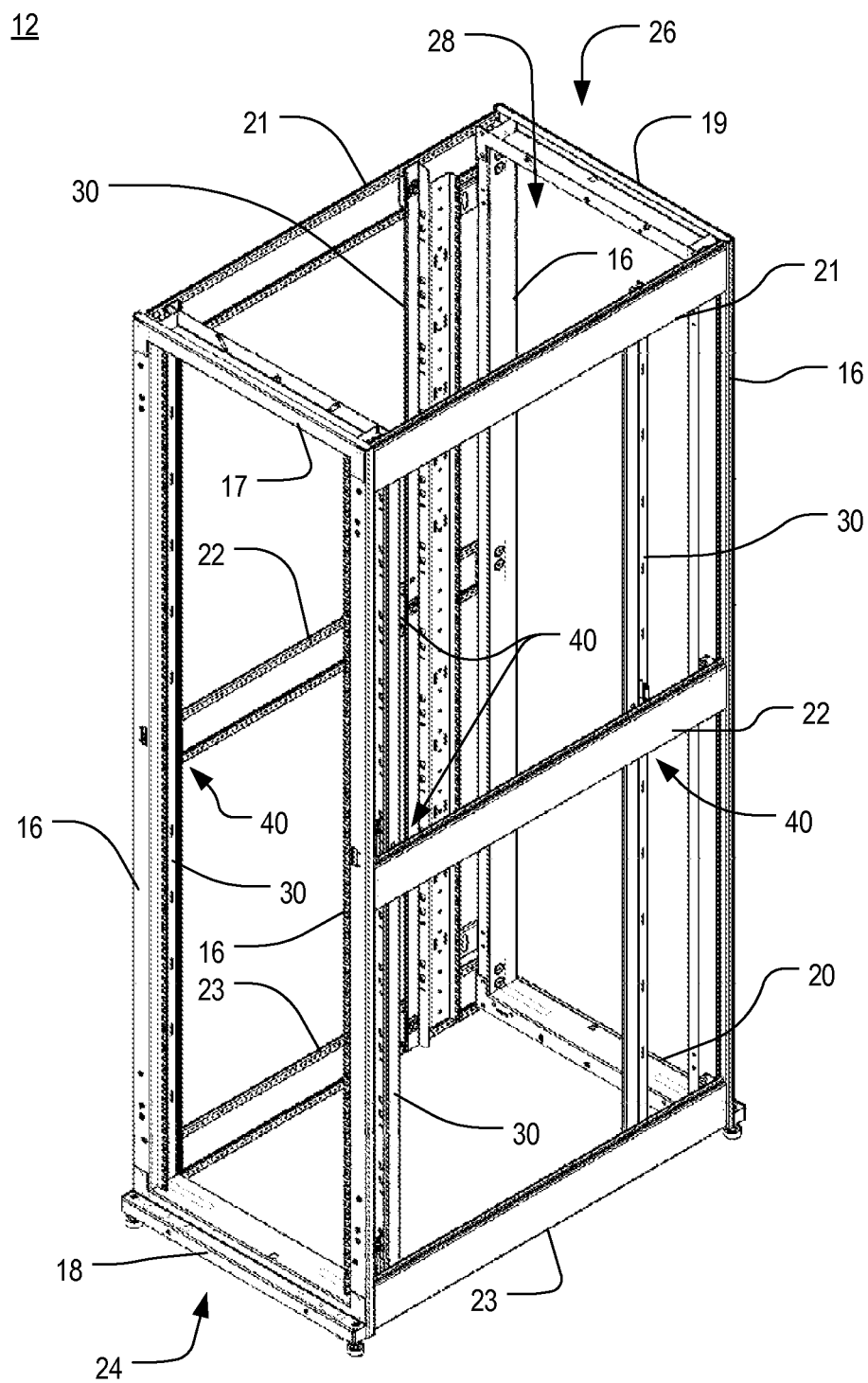
FIG. 1 is a front orthogonal view of an electronic equipment frame structure with vertical mounting rails installed thereon using mounting clamps in accordance with one or more preferred embodiments of the present invention.

As a preliminary matter, it will readily be understood by one having ordinary skill in the relevant art ("Ordinary Artisan") that the present invention has broad utility and application. Furthermore, any embodiment discussed and identified as being "preferred" is considered to be part of a best mode contemplated for carrying out the present invention. Other embodiments also may be discussed for additional illustrative purposes in providing a full and enabling disclosure of the present invention. Moreover, many embodiments, such as adaptations, variations, modifications, and equivalent arrangements, will be implicitly disclosed by the embodiments described herein and fall within the scope of the present invention.

Accordingly, while the present invention is described herein in detail in relation to one or more embodiments, it is to be understood that this disclosure is illustrative and exemplary of the present invention, and is made merely for the purposes of providing a full and enabling disclosure of the present invention. The detailed disclosure herein of one or more embodiments is not intended, nor is to be construed, to limit the scope of patent protection afforded the present invention, which scope is to be defined by the claims and the equivalents thereof. It is not intended that the scope of patent protection afforded the present invention be defined by reading into any claim a limitation found herein that does not explicitly appear in the claim itself.

Thus, for example, any sequence(s) and/or temporal order of steps of various processes or methods that are described herein are illustrative and not restrictive. Accordingly, it should be understood that, although steps of various processes or methods may be shown and described as being in a sequence or temporal order, the steps of any such processes or methods are not limited to being carried out in any particular sequence or order, absent an indication otherwise. Indeed, the steps in such processes or methods generally may be carried out in various different sequences and orders while still falling within the scope of the present invention. Accordingly, it is intended that the scope of patent protection afforded the present invention is to be defined by the appended claims rather than the description set forth herein.

Additionally, it is important to note that each term used herein refers to that which the Ordinary Artisan would understand such term to mean based on the contextual use of such term herein. To the extent that the meaning of a term used herein—as understood by the Ordinary Artisan based on the contextual use of such term—differs in any way from any particular dictionary definition of such term, it is intended that the meaning of the term as understood by the Ordinary Artisan should prevail.

Furthermore, it is important to note that, as used herein, "a" and "an" each generally denotes "at least one," but does not exclude a plurality unless the contextual use dictates otherwise. Thus, reference to "a picnic basket having an apple" describes "a picnic basket having at least one apple" as well as "a picnic basket having apples." In contrast, reference to "a picnic basket having a single apple" describes "a picnic basket having only one apple."

When used herein to join a list of items, "or" denotes "at least one of the items," but does not exclude a plurality of items of the list. Thus, reference to "a picnic basket having cheese or crackers" describes "a picnic basket having cheese without crackers," "a picnic basket having crackers without cheese," and "a picnic basket having both cheese and crackers." Finally, when used herein to join a list of items, "and" denotes "all of the items of the list." Thus, reference to "a picnic basket having cheese and crackers" describes "a picnic basket having cheese, wherein the picnic basket further has crackers," as well as describes "a picnic basket having crackers, wherein the picnic basket further has cheese."

Referring now to the drawings, in which like numerals represent like components throughout the several views, the preferred embodiments of the present invention are next described. The following description of one or more preferred embodiment(s) is merely exemplary in nature and is in no way intended to limit the invention, its application, or uses.

FIG. 1 is a front orthogonal view of an electronic equipment frame structure 12 with vertical mounting rails 30 installed thereon using mounting clamps 40 in accordance with one or more preferred embodiments of the present invention. As shown in FIG. 1, the frame structure 12 includes four vertical support posts 16, upper and lower front cross members 17,18, upper and lower rear cross members 19,20 and three pairs of side cross members 21,22,23. Each vertical support post 16 includes a plurality of cross member attachment apertures at each end. Two of the vertical support posts 16 are connected together at their upper and lower ends by the upper and lower front cross members 17,18, respectively, and the other two support posts 16 are connected together at their upper and lower ends by the upper and lower rear cross members 19,20, respectively. The front cross members 17,18 and their respective support posts 16 thus define a front frame 24, and the rear cross members 19,20 and their respective support posts 16 define a rear frame 26. The front and rear frames 24,26 may then be connected together at their respective corners by the upper, middle and lower side cross members 21,22,23.

Figure 2:
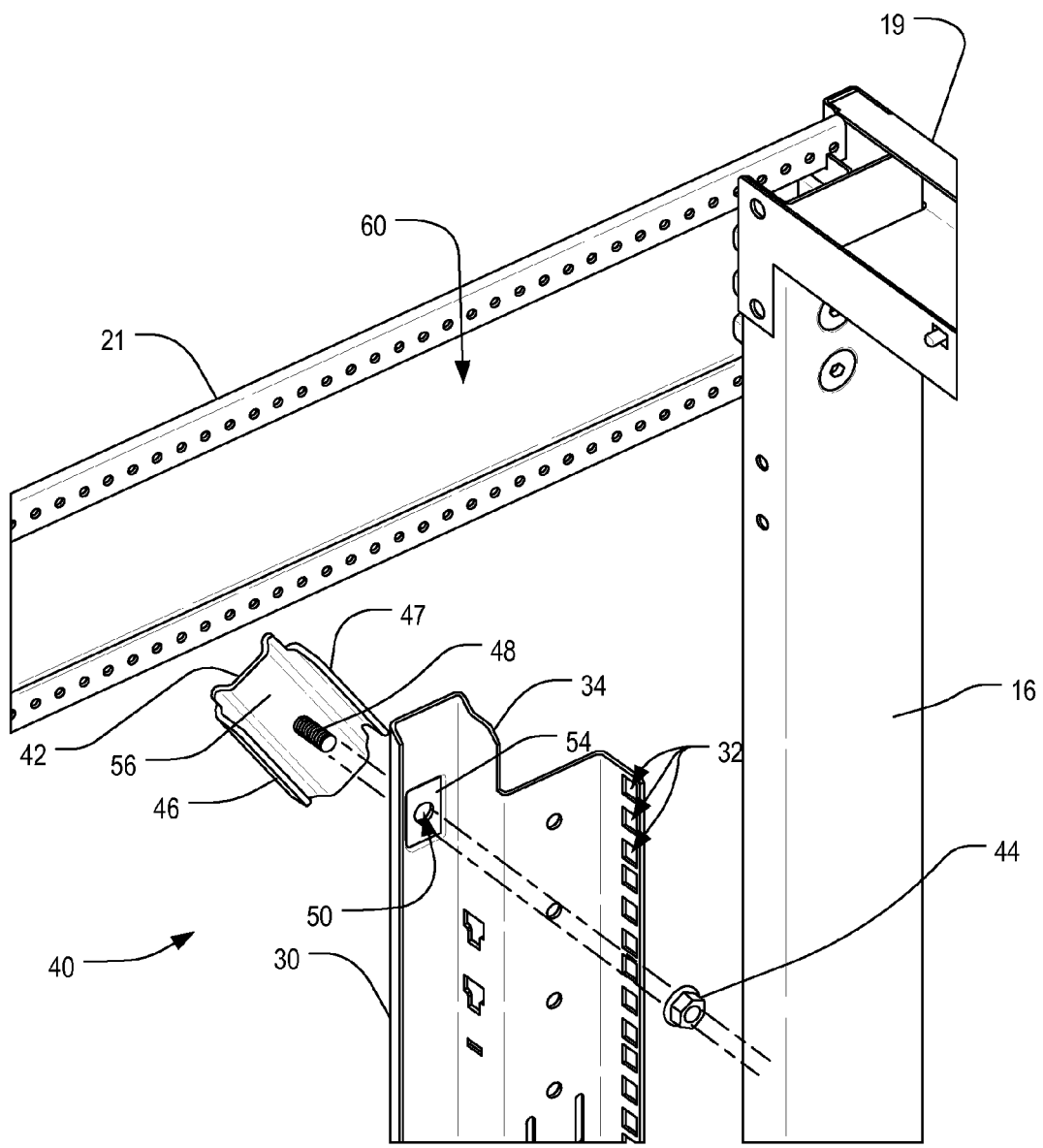
FIG. 2 is an enlarged, fragmentary, partially exploded isometric view of top portions of the electronic equipment frame structure and one of the vertical mounting rails of FIG. 1, shown in connection with the mounting clamp.

Although the particular frame structure 12 described and illustrated herein may include various novel aspects, it will be apparent to the Ordinary Artisan that various aspects of the present invention are likewise applicable to frame structures of generally conventional design and construction. Furthermore, various different connection means may be used to join the various members together. One novel connection means is illustrated in FIGS. 1 and 2. However, although not illustrated herein, it will be apparent to the Ordinary Artisan that in at least some embodiments, any of a variety of other connection means may be used instead. In this regard, other examples of conventional connection means are described in commonly-assigned U.S. Pat. No. 6,185,098, U.S. Pat. No. 7,119,282, U.S. Pat. No. 7,697,285, U.S. Patent Application Publication No. US 2009/0190307 A1, U.S. Patent Application Publication No. US 2009/0227197 A1, U.S. Patent Application Publication No. US 2009/0283488 A1, and U.S. Patent Application Publication No. US 2010/0172092 A1, the entirety of each of which is incorporated herein by reference. Although likewise not illustrated herein, the precision and the stability of each of the corners of at least some types of four post frame structures may be enhanced by utilizing a self-squaring corner attachment bracket such as that disclosed by the commonly-assigned U.S. Pat. No. 5,997,117 entitled "RACK FRAME CABINET," the entirety of which is hereby incorporated by reference.

Still further, it will be evident to the Ordinary Artisan that in at least some embodiments, other structural arrangements may be used to form a frame structure on which panels may be mounted to form an electronic equipment enclosure. For example, in at least one embodiment (not illustrated), a frame structure may be formed from only two support posts.

The frame structure 12 may include a plurality of panels (not illustrated), attached thereto, which partially or fully enclose the frame structure to form an electronic equipment enclosure. In contemplated embodiments, the enclosure may include right and/or left panels, a front panel, and a rear panel, one or more of which may be configured to operate as a door to the interior of the enclosure. The enclosure may further include a generally flat top panel (not illustrated) sized and shaped to fit an opening 28 defined by the four vertical support posts 16 in connection with the upper front cross member 17, the upper rear cross member 19, and the upper side cross members 21. The frame structure may include various different panel configurations, connection means and other features that are described in co-pending, commonly-assigned non-provisional patent application Ser. No. 13/229,704, entitled, "ELECTRONIC EQUIPMENT CABINET STRUCTURE," and Ser. No. 13/229,705, entitled, "CABLE PASS-THROUGH PANEL FOR ELECTRONIC EQUIPMENT ENCLOSURE."

As shown in FIG. 1, the frame structure 12 further includes one or more vertical mounting rails 30 that extend therein in a generally vertical orientation. As better seen in FIG. 2, each vertical mounting rail 30 typically has a series of holes 32 formed therein to facilitate easy mounting of a wide variety of equipment to the frame structure 12. As will be explained in greater detail, a mounting clamp 40 may be used to facilitate attachment of the vertical mounting rail 30 to the frame structure 12.

FIG. 2 is an enlarged, fragmentary, partially exploded isometric view of top portions of the electronic equipment frame structure 12 and one of the vertical mounting rails 30 of FIG. 1, shown in connection with the mounting clamp 40. As shown in FIG. 2, the mounting clamp 40 includes a clamping bracket 42, a threaded rod 48, and a clamp nut 44. Extending at opposite lateral edges of the clamping bracket 42 are flanges 46,47. The flanges 46,47 are spaced apart from one another at a distance that is at least slightly greater than the width of a portion of the vertical mounting rail 30. In this regard, the clamping bracket 42 is shaped so as to fit loosely around such portion of the vertical mounting rail 30 during the fastening process, as will be explained in greater detail below. In between the flanges 46,47 and extending the length of the clamping bracket 42 is a raised central portion 56, which interfaces with the vertical mounting rail 30 during the fastening process.

The clamping bracket 42 further includes an aperture to accommodate the threaded rod 48, which may be rigidly attached to the clamping bracket 42 and is sized to extend through an aperture 50 in the vertical mounting rail 30. The clamp nut 44 engages with and fastens to the threaded rod 48 in order to attach the clamping bracket 42 to the vertical mounting rail 30. In an embodiment of the present invention depicted in the drawing, the threaded rod 48 is a weld stud that is welded to the clamping bracket 42. Alternatively, it is also within the scope of the present invention to use a PEW® nut or a weld nut to clamp the clamping bracket 42 to the vertical mounting rail 30.

Figure 6:
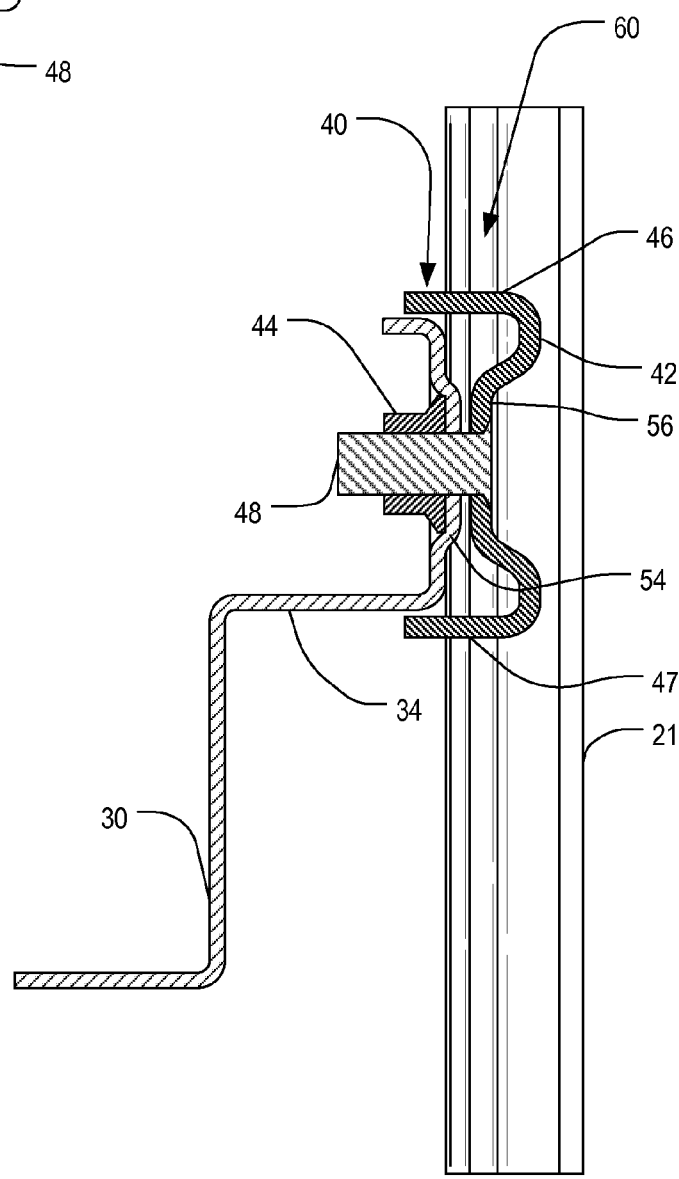
FIG. 6 is an enlarged top cross-sectional view of the mounting clamp of FIG. 4, taken along line 6-6.

As further shown in FIG. 2, and perhaps best seen in FIG. 6, the vertical mounting rail 30 includes a C-shaped portion 34 when viewed in profile. At the "back" of the C-shape, near an end of the vertical mounting rail 30, is an embossed portion 54 sized to accommodate the clamp nut 44. The embossed portion 54 interfaces with the raised central portion 56 of the clamping bracket 42 during the fastening process. The embossed portion 54 may help stiffen the vertical mounting rail 30 at the point of attachment, thereby facilitating a more rigid and sturdy mount for the mounting rail 30. Additionally, the embossed portion 54 may help to prevent the vertical mounting rail 30 from buckling when excess torque is applied thereto during the fastening process.

Figure 3:
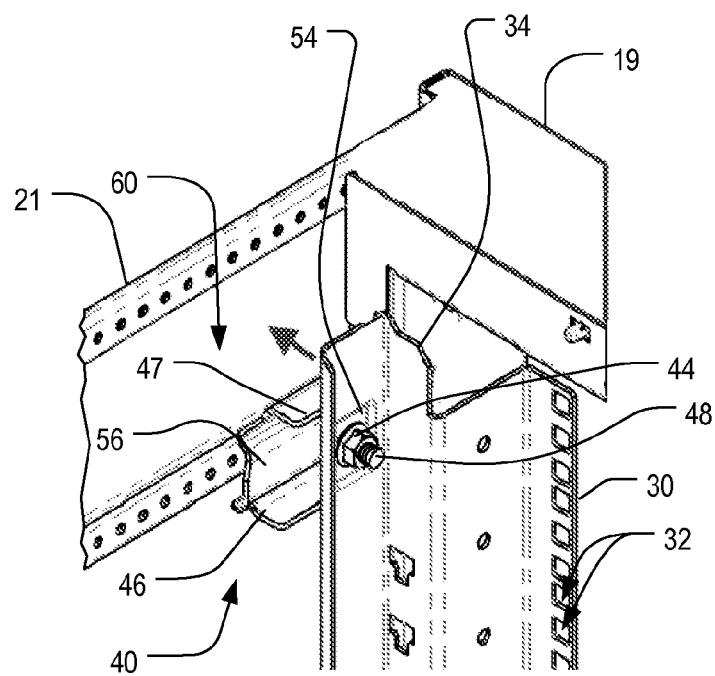
FIG. 3 is an enlarged, fragmentary, partially exploded orthogonal view of top portions of the electronic equipment frame structure and vertical mounting rail of FIG. 2, shown with a clamping bracket of the mounting clamp attached to the mounting rail.
Figure 4:
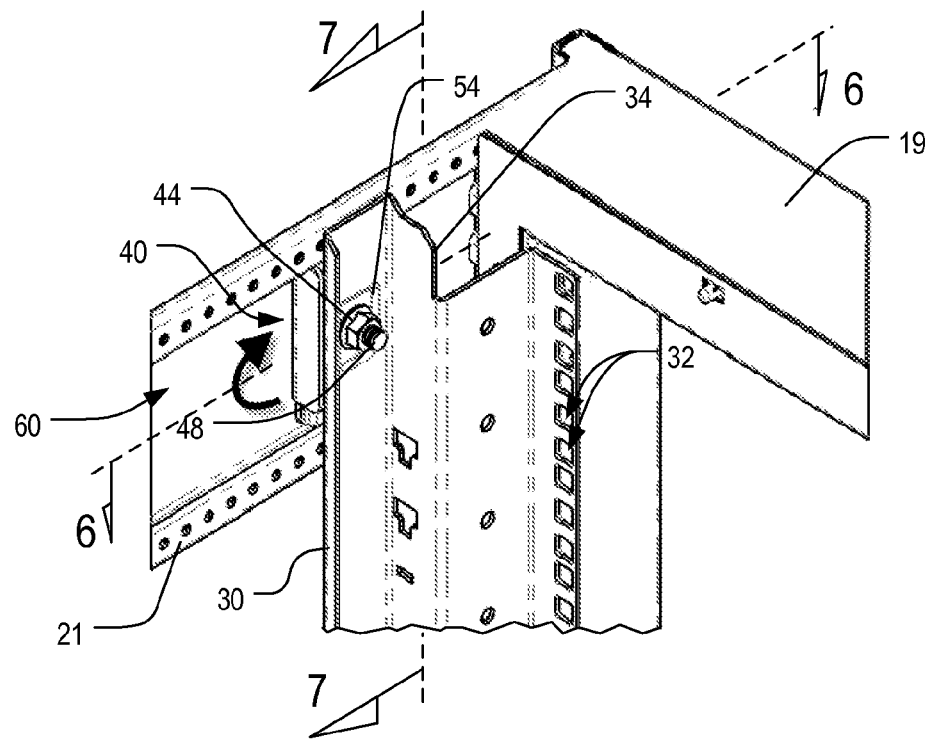
FIG. 4 is an enlarged, fragmentary orthogonal view of top portions of the electronic equipment frame structure and vertical mounting rail of FIG. 2, shown with the mounting rail installed on the frame structure using the mounting clamp.

FIG. 3 is an enlarged, fragmentary, partially exploded orthogonal view of top portions of the electronic equipment frame structure 12 and vertical mounting rail 30 of FIG. 2, shown with a clamping bracket 42 of the mounting clamp 40 at least loosely attached to the mounting rail 30, and FIG. 4 is an enlarged, fragmentary orthogonal view of top portions of the electronic equipment frame structure 12 and vertical mounting rail 30 of FIG. 2, shown with the mounting rail 30 installed on the frame structure 12 using the mounting clamp 40. As shown in FIGS. 3 and 4, the clamping bracket 42 of the mounting clamp 40 can be fastened to the vertical mounting rail 30 before the mounting rail 30 is mounted to the frame structure 12. In particular, the threaded rod 48 of the mounting clamp 40 extends through the aperture 50 of the vertical mounting rail 30 and the clamp nut 44 is used at the other side thereof to fasten the clamping bracket 42, at least loosely, to the mounting rail 30. Before the clamp nut 44 is tightened snugly against the embossed portion 54 of the vertical mounting rail 30, the clamping bracket 42 is oriented in a rotated sideways position so that the flanges 46,47 of the clamping bracket 42 are generally across the back of the C-shaped portion 34 of the vertical mounting rail 30, as can perhaps best be seen in FIG. 3. The clamping bracket 42 may then be inserted into and aligned with an interior-facing channel 60 of the corresponding side cross member 21,22,23 to which the vertical mounting rail 30 is to be fastened (indicated by the directional arrow of FIG. 3), as will be explained in greater detail below. As shown in FIG. 4, the clamping bracket 42 may then be rotated in a clockwise direction one quarter turn (indicated by the directional arrow of FIG. 4) so that the flanges 46,47 of the clamping bracket 42 are aligned with and straddle the C-shaped portion 34 of the vertical mounting rail 30 and ends of the clamping bracket 42 are wedged into the channel 60 of the corresponding side cross member 21,22,23. As the clamp nut 44 is tightened, the C-shaped portion 34 of the vertical mounting rail 30 becomes seated between the flanges 46,47 of the clamping bracket 42. The clamping bracket 42 is thereby prevented from further rotation due to interference with the C-shaped portion 34 of the vertical mounting rail 30.

Figure 5:
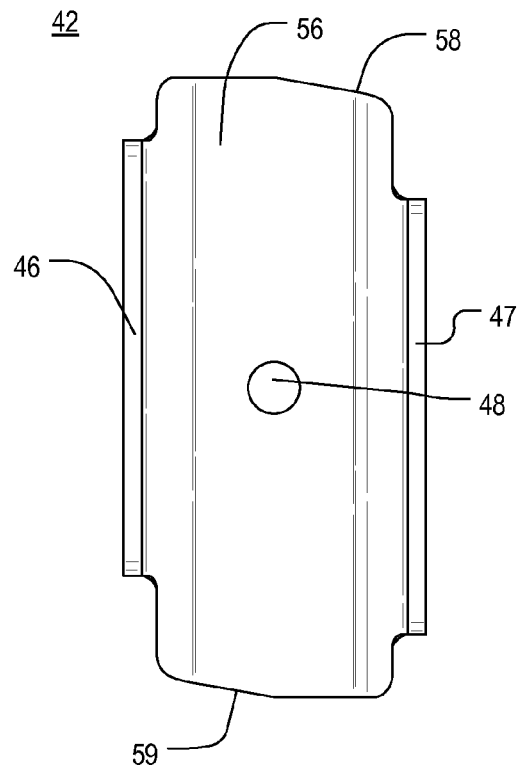
FIG. 5 is a front plan view of the clamping bracket of the mounting clamp of FIGS. 2-4, shown with a threaded rod attached thereto.

FIG. 5 is a front plan view of the clamping bracket 42 of the mounting clamp 40 of FIGS. 2-4, shown with a threaded rod 48 attached thereto. The clamping bracket 42 is preferably made from a metal-based material. As shown in FIG. 5, the flanges 46,47 are located at opposite sides of the clamping bracket 42 with the raised central portion 56 therebetween. The threaded rod 48 is located generally at the center of the clamping bracket 42 and extends from the raised central portion 56. Additionally, the clamping bracket 42 may include, at each end thereof, a cut or beveled edge 58,59 to facilitate rotation of the clamping bracket 42 within the channel 60 of the side cross member 21,22,23 to which it is fastened. In this regard, the cut edge 58,59 of each end is located at one side thereof such that the cut edges 58,59 are positioned at corners that are diagonally opposite one another on the clamping bracket 42. In particular, rotation is facilitated because the bottom portions of the channel 60 do not interfere with the cut edges 58,59 during rotation, whereas square corners would. Although not shown in FIG. 5, it is also contemplated that the clamping bracket 42 may include apertures extending therethrough to accommodate additional clamping fasteners.

FIG. 6 is an enlarged top cross-sectional view of the mounting clamp 40 of FIG. 4, taken along line 6-6. As shown in FIG. 6, when the vertical mounting rail 30 is fastened to the frame structure 12, the flanges 46,47 of the clamping bracket 42 straddle the C-shaped portion 34 of the vertical mounting rail 30. In this regard, the vertical mounting rail 30 may help prevent excess rotation of the clamping bracket 42 during the fastening process. Additionally, the clamp nut 44 is aligned with the embossed portion 54 of the vertical mounting rail 30, which itself is aligned with the raised central portion 56 of the clamping bracket 42, thereby locally adding stiffness and helping to prevent the vertical mounting rail 30 from buckling when torque is applied. Furthermore, the flanges 46,47 of the clamping bracket 42 provide further stiffness to the mounting clamp 40, which can permit the clamping bracket 42 to be manufactured to be thinner and, thus, can reduce the amount of raw material needed to manufacture the clamping bracket 42.

Figure 7:
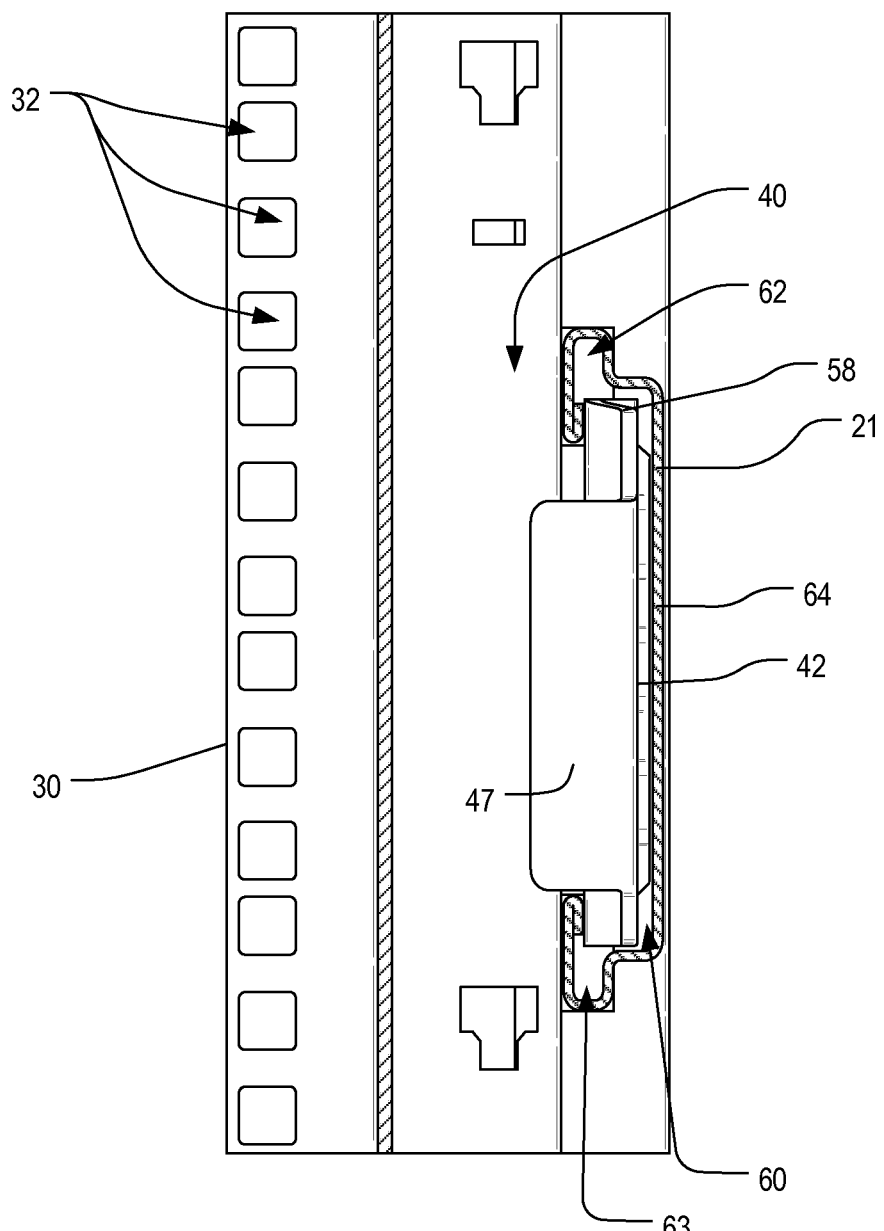
FIG. 7 is an enlarged rear cross-sectional view of a side cross member of the electronic equipment frame structure of FIG. 4, taken along line 7-7.

FIG. 7 is an enlarged rear cross-sectional view of a side cross member 21 of the electronic equipment frame structure 12 of FIG. 4, taken along line 7-7. In FIG. 7, the interior-facing channel 60 of the side cross member 21,22,23 is shown in cross-section. As shown in FIG. 7, the channel 60 includes upper and lower portions 62,63 that are formed from peripheral webs extending from a central web 64 of the cross member 21,22,23. The upper and lower channel portions 62,63 are sized to accommodate ends of the clamping bracket 42 as it is rotated into the channel 60 (as perhaps best seen in FIG. 4). The cut edges 58,59 facilitate such rotation and permit the clamping bracket 42 to be effectively wedged in the channel 60, thereby fastening the vertical mounting rail 30 to the frame structure 12 when the clamp nut 44 is tightened. The shape of the channel 60, which runs along the length of the side cross member 21,22,23 also permits adjustment of the vertical mounting rail 30 in either the fore or aft direction. The geometry and shape of the clamping bracket 42 reduce the likelihood of binding when the vertical mounting rail 30 is adjusted in the fore or aft direction within the channel 60.

Additionally, the clamping bracket 42 can be provided in a pre-assembled state, where the clamping bracket 42 is already at least loosely attached to the vertically mounting rail 30 with the clamp nut 44 engaging the threaded rod 48 (as perhaps best seen in FIG. 3). When the pre-assembled vertical mounting rail 30 is to be fastened to the frame structure 12, the mounting rail 30 can be quickly and easily installed by inserting the clamping bracket 42 into the channel 60 of a side cross member 21,22,23 and then locking the clamping bracket 42 into position by rotating the clamping bracket 42 one quarter turn and tightening the clamp nut 44.

Based on the foregoing information, it will be readily understood by those persons skilled in the art that the present invention is susceptible of broad utility and application. Many embodiments and adaptations of the present invention other than those specifically described herein, as well as many variations, modifications, and equivalent arrangements, will be apparent from or reasonably suggested by the present invention and the foregoing descriptions thereof, without departing from the substance or scope of the present invention.

Accordingly, while the present invention has been described herein in detail in relation to one or more preferred embodiments, it is to be understood that this disclosure is only illustrative and exemplary of the present invention and is made merely for the purpose of providing a full and enabling disclosure of the invention. The foregoing disclosure is not intended to be construed to limit the present invention or otherwise exclude any such other embodiments, adaptations, variations, modifications or equivalent arrangements; the present invention being limited only by the claims appended hereto and the equivalents thereof.

What is claimed is:

1. An electronic equipment enclosure comprising:
  a) a frame structure that includes side cross members between front and rear frames, wherein at least one of the side cross members defines an interior-facing channel that extends at least substantially along the length thereof;
  b) a vertical mounting rail; and
  c) a clamping bracket attached to the vertical mounting rail;
  d) wherein, upon insertion into the channel, the clamping bracket is rotatable within the channel to tighten, and thereby fasten, the vertical mounting rail to the frame structure.

2. The electronic equipment enclosure of claim 1, wherein the vertical mounting rail includes an embossed portion at a location where the clamping bracket is attached thereto.

3. The electronic equipment enclosure of claim 1, wherein the clamping bracket is attached to the vertical mounting rail via a threaded rod and a separate clamp nut.

4. The electronic equipment enclosure of claim 3, wherein the threaded rod extends from a raised central portion of the clamping bracket and is rigidly attached thereto.

5. The electronic equipment enclosure of claim 4, wherein, when the clamping bracket is attached to the vertical mounting rail, the raised central portion of the clamping bracket is aligned with an embossed portion of the vertical mounting rail.

6. The electronic equipment enclosure of claim 1, wherein the clamping bracket includes a flange at each side thereof and extending away from the central portion, each in the same direction.

7. The electronic equipment enclosure of claim 6, wherein the flanges are spaced apart from one another so as to fittingly interface with and straddle a C-shaped portion of the vertical mounting rail.

8. The electronic equipment enclosure of claim 1, wherein the clamping bracket includes cut edges at opposite ends thereof to facilitate rotation of the clamping bracket within the channel.

9. The electronic equipment enclosure of claim 8, wherein the vertical mounting rail is fastenable to the frame structure with a quarter turn of the clamping bracket such that the ends of the clamping bracket enter into upper and lower portions of the channel.

10. The electronic equipment enclosure of claim 8, wherein the cut edges are located at end corners, of the clamping bracket, that are diagonally opposite one another.

11. The electronic equipment enclosure of claim 1, wherein the clamping bracket is made from a metal-based material.

12. A mounting clamp for use in fastening a vertical mounting rail in an electronic equipment enclosure, the mounting clamp comprising:
  a) a clamping bracket, including:
    (i) a central portion having a pair of ends; and
    (ii) a pair of flanges, each flange extending from the central portion at opposite sides thereof, the flanges being spaced apart from one another to straddle a C-shaped portion of a vertical mounting rail;
  (b) a threaded rod rigidly attached to the clamping bracket and extending from the central portion; and
  (c) a nut for engagement with the threaded rod to permit fastening of the clamping bracket to the vertical mounting rail.

13. The mounting clamp of claim 12, wherein the central portion of the clamping bracket includes a cut edge at each end thereof to facilitate rotation of the clamping bracket within a channel of the vertical mounting rail.

14. The mounting clamp of claim 13, wherein the cut edges are located at corners of the central portion that are diagonally opposite one another.

15. A method of fastening a vertical mounting rail to an electronic equipment enclosure comprising the steps of:
  (a) providing a frame structure that includes side cross members between front and rear frames, wherein at least one of the side cross members defines an interior-facing channel that extends at least substantially along the length thereof;
  (b) loosely attaching a clamping bracket having a pair of spaced-apart flanges at sides thereof to a vertical mounting rail having a C-shaped portion;
  (c) configuring the clamping bracket such that the pair of spaced-apart flanges are oriented crosswise relative to the vertical mounting rail;
  (d) inserting the clamping bracket into the channel of a selected side cross member; and (e) rotating the clamping bracket within the channel to position ends of the clamping bracket within the channel and align the spaced-apart flanges to straddle the C-shaped portion.

16. The method of claim 15, wherein cut edges are arranged at diagonally opposite corners of a central portion of the clamping bracket, and wherein the rotating step includes rotating the clamping bracket such that the cut edges are the leading edges as the rotation is carried out.

17. The method of claim 15, wherein the rotating step includes one quarter turn of rotation.

18. The method of claim 15, wherein the attaching step includes attaching the clamping bracket to the vertical mounting rail with a threaded rod and a clamp nut.

19. The method of claim 18, further comprising, after the rotating step, the step of tightening the clamp nut.

* * * * *